(12) United States Patent
Akazawa

(10) Patent No.: US 12,012,649 B2
(45) Date of Patent: Jun. 18, 2024

(54) ERBIUM-DOPED BISMUTH OXIDE FILM

(71) Applicant: Nippon Telegraph and Telephone Corporation, Tokyo (JP)

(72) Inventor: Hosei Akazawa, Musashino (JP)

(73) Assignee: NIPPON TELEGRAPH AND TELEPHONE CORPORATION, Tokyo (JP)

(*) Notice: Subject to any disclaimer, the term of this patent is extended or adjusted under 35 U.S.C. 154(b) by 537 days.

(21) Appl. No.: 17/288,677

(22) PCT Filed: Nov. 19, 2019

(86) PCT No.: PCT/JP2019/045317
§ 371 (c)(1),
(2) Date: Apr. 26, 2021

(87) PCT Pub. No.: WO2020/110839
PCT Pub. Date: Jun. 4, 2020

(65) Prior Publication Data
US 2021/0395876 A1  Dec. 23, 2021

(30) Foreign Application Priority Data

Nov. 28, 2018 (JP) ................................ 2018-222616

(51) Int. Cl.
*C23C 14/08* (2006.01)
*C23C 14/34* (2006.01)
*C23C 14/58* (2006.01)

(52) U.S. Cl.
CPC .......... *C23C 14/08* (2013.01); *C23C 14/3414* (2013.01); *C23C 14/58* (2013.01)

(58) Field of Classification Search
CPC ...................................................... C23C 14/08
See application file for complete search history.

(56) References Cited

U.S. PATENT DOCUMENTS

2010/0020668 A1* 1/2010 Narumi ................ G11B 7/0062

FOREIGN PATENT DOCUMENTS

| JP | 2012-77359 A | 4/2012 |
| JP | 2018-24779 A | 2/2018 |

OTHER PUBLICATIONS

M. Vila et al., $\alpha$-$Bi_2O_3$ *Microcrystals and Microrods: Thermal Synthesis, Structural and Luminescence Properties*, Journal of Alloys and Compounds, vol. 548, 2013, pp. 188-193.

(Continued)

*Primary Examiner* — John J Brayton
(74) *Attorney, Agent, or Firm* — Workman Nydegger

(57) ABSTRACT

An erbium-doped bismuth oxide emitting light from high-intensity $Er^{3+}$ ions is produced. Provided is a method of producing an erbium-doped bismuth oxide film including: a step of disposing a first sputtering target containing the bismuth oxide, a second sputtering target containing erbium oxide ($Er_2O_3$), and a substrate in a closed film forming chamber separately from each other; a step of setting the temperature of the substrate to room temperature, introducing $H_2O$ gas into the film forming chamber at a predetermined pressure, and supplying $H_2O$ gas in the vicinity of the substrate; a step of simultaneously sputtering the first sputtering target and the second sputtering target to deposit a part of the first sputtering target and a part of the second sputtering target on the substrate to form a precursor film; and a step of forming a crystalline film by heating the precursor film at a predetermined temperature.

13 Claims, 9 Drawing Sheets

(56) References Cited

OTHER PUBLICATIONS

Xin Yang et al., *Enhanced Photocatalytic Performance: a β-$Bi_2O_3$ Thin Film by Nanoporous Surface*, Journal of Physics D: Applied Physics, vol. 46, 2013, pp. 1-7.
S. Iyyapushpam et al., *Enhanced Photocatalytic Degradation of Methyl Orange by Gamma $Bi_2O_3$ and its Kinetics*, Journal of Alloys and Compounds, vol. 601, 2014, pp. 85-87.
A. Helfen et al., *Structure and Stability Studies of Electrodeposited δ-$Bi_2O_3$*, Solid State Ionics, vol. 176, 2005, pp. 629-633.
Yuki Kondo et al., *Emission and Gain Characteristics of Er-Doped Bismuthate Channel Waveguide*, Proceedings of the 2004 Electronics Society Conference of the Institute of Electronics, Information and Communication Engineers, 2004, pp. 1-2.

* cited by examiner

ERBIUM-DOPED BISMUTH OXIDE FILM

TECHNICAL FIELD

The present invention relates to a method of producing an erbium-doped bismuth oxide film, which is mainly applied to optical amplifiers.

BACKGROUND ART

The core of the technology related to optical communication networks is the elemental technology of optical fibers used as optical waveguides. In the related art, an optical fiber made of quartz, that is, silicon dioxide (hereinafter referred to as $SiO_2$) as a base material has been used as an optical waveguide capable of transmitting optical signals over a long distance. This is because $SiO_2$ has a very high transmittance for light with a wavelength around 1.5 μm used as an optical communication band. The intensity of the optical signal, which is light, is slightly attenuated due to absorption or scattering while propagating in the optical fiber, and the intensity of the optical signal is reduced. Here, an optical component having a function of amplifying the intensity of the optical signal is required in order to suppress the intensity of the optical signal from decreasing and maintain or increase the intensity of the optical signal.

An optical fiber amplifier is used as an optical component that plays the role. The optical fiber amplifier is configured by adding an impurity element that is excited by light of a specific wavelength to cause stimulated emission to a base material of the optical fiber. Rare earth elements such as erbium (hereinafter referred to as Er) are mainly used as the impurities. The optical fiber amplifier added or doped with Er (in this specification, the terms "added" and "doped" are synonymous with each other) is called an Er-doped (erbium doped) optical fiber amplifier (hereinafter referred to as "EDFA") and commonly used.

The principle of EDFA will be briefly described. Er ions added to the base material as an impurity element, that is, $Er^{3+}$ ions are the light emission source in the EDFA. After the excitation of $Er^{3+}$ ions between the $4f$ levels by the signal light input to the EDFA, the intensity of the signal light is amplified in the EDFA by the superposition effect of the excitation light that is stimulated and emitted from the $Er^{3+}$ ions.

Here, the reason why the $Er^{3+}$ ions are used as a light emission source is that the light emission due to stimulated emission from the $4f$ level of the $Er^{3+}$ ions is in the energy band in which high intensity is stably exhibited. Another reason is that the wavelength of light emitted by stimulated emission from the $4f$ level of $Er^{3+}$ ions is from 1.3 to 1.5 μm in the infrared wavelength band, and this wavelength coincides with the wavelength at which the degree of light absorption of $SiO_2$, which is the base material, is the lowest. That is, the advantage that the light emitted from $Er^{3+}$ ions is not absorbed by the base material is utilized.

Here, the base material $SiO_2$ is sufficiently oxidized. As a result, the interaction between $Er^{3+}$ ions and $SiO_2$ is weak, and it is difficult to further improve the emission intensity by utilizing the electronic interaction between the base material and the impurities as is known in the art. At present, by adopting an oxide crystal having a heavy element such as bismuth (hereinafter referred to as Bi) as a constituent element as a base material, it is expected that the emission intensity from $Er^{3+}$ ions will be further increased by the interaction between the $Er^{3+}$ ion as an impurity and the base material. In particular, bismuth oxide (hereinafter referred to as $Bi_2O_3$) is expected to be a promising base material. This is because the valences of $Bi^{3+}$ ion and $Er^{3+}$ ion are both trivalent, and both are heavy elements, thus their ionic radii are close to each other, so that the $Bi^{3+}$ ion site of the $Bi_2O_3$ crystal can be directly replaced by the $Er^{3+}$ ion without affecting the crystal structure of the $Bi_2O_3$ crystal.

Further, it is known that a $Bi_2O_3$ doped with $Er^{3+}$ ions (hereinafter, referred to as $Bi_2O_3$:Er) film can be obtained by, for example, a sputtering method.

CITATION LIST

Non Patent Literature

Non Patent Literature (NPL) 1: M. Vila, C. Diaz-Guerra, and J. Piqueras, J. Alloys Compd., 2013, vol. 548, pp. 188-193.

NPL 2: X. Yang, X. Lian, S. Liu, G. Wang, C. Jiang, J. Tian, J. Chen, and R. Wang, Journal of Physics D: Applied Physics, 2013, Vol. 46, No. 035103.

NPL 3: S. Iyyapushpam, S. T. Nishanti, and D. Pathinettam Padiyan, Journal of. Alloys and Compounds, 2014, No. 601, pp. 85-87.

NPL 4: A. Helfen, S. Merkourakis, G. Wang, M. G. Walls, E. Roy, K. Yu-Zhang, and Y. Leprince-Wang, Solid State Ionics, 2005, No. 176, pp. 629-633.

SUMMARY OF THE INVENTION

Technical Problem

When forming a $Bi_2O_3$ doped with $Er^{3+}$ ions (hereinafter, referred to as $Bi_2O_3$:Er) by a sputtering method, a $Bi_2O_3$:Er film obtained by introducing oxygen gas into a film forming chamber of a sputtering apparatus does not show sufficiently high intensity emission. This is because the oxygen molecules of the introduced oxygen gas are ionized or dissociated in plasma to generate a large amount of oxygen radicals or oxygen ions in the film forming chamber. When the oxygen radicals or oxygen ions come into contact with or act on the sputtered film formed on the substrate, the sputtered film is excessively oxidized. As a result, $Er^{3+}$ ions generate erbium oxide (hereinafter referred to as $Er_2O_3$) in the $Bi_2O_3$:Er film, and are independently precipitated at the crystal grain boundaries of $Bi_2O_3$:Er. Due to this phenomenon, the interaction between the $Er^{3+}$ ion and the $Bi_2O_3$ crystal in the $Bi_2O_3$:Er film is weakened.

On the other hand, when a $Bi_2O_3$:Er film is formed by a sputtering method without introducing a gas serving as an oxygen source into the film forming chamber, oxygen atoms are selectively desorbed from the $Bi_2O_3$ target during the film formation, and the vicinity of the surface of the $Bi_2O_3$ target is in a reduced state. Along with this, the vicinity of the surface of the $Bi_2O_3$:Er film deposited on the substrate is also similarly reduced too much. The $Bi_2O_3$:Er film obtained under these conditions hardly emits light even if it is in an excited state because the excitation energy is highly likely to be dissipated by the non-radiative transition.

As described above, in order to obtain high-intensity light emission from $Er^{3+}$ ions by utilizing the excitation energy transfer to $Er^{3+}$ ions when the $Bi_2O_3$ crystal is excited, it is necessary to replace the cation sites of $Bi_2O_3$ crystal in the $Bi_2O_3$:Er film with $Er^{3+}$ ions in a predetermined manner. For that purpose, it is necessary to keep a moderate degree of oxidation of the $Bi_2O_3$ crystal as the base material. Here, the oxidation degree is an index indicating the degree of oxygen deficiency in the oxide crystal.

In the case of obtaining a $Bi_2O_3$:Er film that exhibits high-intensity emission from $Er^{3+}$ ions, considering the degree of oxidation of the $Bi_2O_3$:Er film, it is necessary to obtain a $Bi_2O_3$:Er film which is not in an excessively oxidized state or in an excessively reduced state.

Here, when the surface of the $Bi_2O_3$ target is reduced as the sputtering film formation process is repeatedly used, the O/Bi atomic ratio supplied to the surface of the substrate during the sputtering film formation is less than 1. At this time, it is sufficient to supply oxygen gas to the surface of the substrate in an amount such that the O/Bi atomic ratio supplied to the surface of the substrate is exactly 1. However, when the supply amount is small, it is difficult to appropriately control the amount of oxygen gas introduced into the film forming chamber.

Means for Solving the Problem

The present invention has been made to solve the above problems. An embodiment of the present invention provides a method of producing an erbium-doped bismuth oxide film which is a film comprising bismuth oxide ($Bi_2O_3$) as a base material and erbium (Er) added to the base material, the method including: a step of disposing a first sputtering target containing bismuth oxide, a second sputtering target containing erbium oxide ($Er_2O_3$), and a substrate in a closed film forming chamber separately from each other; a step of setting the temperature of the substrate to room temperature, introducing $H_2O$ gas into the film forming chamber at a predetermined pressure, and supplying $H_2O$ gas in the vicinity of the substrate; a step of simultaneously sputtering the first sputtering target and the second sputtering target to deposit a part of the first sputtering target and a part of the second sputtering target on the substrate to form a precursor film; and a step of forming a crystalline film by heating the precursor film at a predetermined temperature.

Effects of the Invention

The $Bi_2O_3$:Er film obtained by introducing $H_2O$ gas to form a film by sputtering can obtain an emission intensity one digit higher than that of the $Bi_2O_3$:Er film obtained by introducing oxygen gas at the same pressure.

BRIEF DESCRIPTION OF DRAWINGS

FIG. 1 is a conceptual diagram of sputtering apparatuses.

DESCRIPTION OF EMBODIMENTS

One embodiment of the present invention is characterized in that $H_2O$ vapor gas (hereinafter, referred to as $H_2O$ gas) is used when the $Bi_2O_3$:Er film is formed by the sputtering method. When the $H_2O$ molecules of the $H_2O$ gas introduced into the film forming chamber are ionized or decomposed in plasma, they generate H and OH radicals and $H^+$ and $OH^-$ ions. H radicals and $H^+$ ions act to reduce the $Bi_2O_3$:Er film, while OH radicals and $OH^-$ ions act to increase the degree of oxidation of the $Bi_2O_3$:Er film. The H radical and the OH radical, and the $H^+$ ions and the $OH^-$ ions are produced in equal amounts, respectively, so that the reducing effect of the H radicals or $H^+$ ions and the oxidation effect of the OH radicals or $OH^-$ ions are balanced, thus the oxidation degree of the obtained $Bi_2O_3$:Er film is kept moderate.

Further, in the plasma during sputtering film formation, in addition to H radicals, OH radicals, $H^+$ ions, and $OH^-$ ions, $H_2O$ molecules of $H_2O$ gas themselves are also taken into the thin film. In order to optically activate the $Er^{3+}$ ions and bring them into a light emission active state, after a $Bi_2O_3$:Er film is formed by a sputtering method, the $Bi_2O_3$:Er film must be post-annealed to carry out crystallization. During this post-annealing process, hydrogen atoms associate with each other in the $Bi_2O_3$:Er film and are desorbed, and as a result, only oxygen atoms remain. Therefore, when the introduction pressure of $H_2O$ gas is high, that is, when the amount of $H_2O$ molecules taken into the $Bi_2O_3$:Er film is large, the $Bi_2O_3$:Er film after the post-annealing treatment is more oxidized, while when the introduction pressure of $H_2O$ gas is low, that is, when the amount of $H_2O$ molecules taken into the $Bi_2O_3$:Er film is small, the film is in a reduced state. Therefore, in order to keep the degree of oxidation of the $Bi_2O_3$:Er film more moderate, it is necessary to adjust the pressure of the $H_2O$ gas introduced into the film forming chamber of the sputtering apparatus to a predetermined value.

Figure 1A:
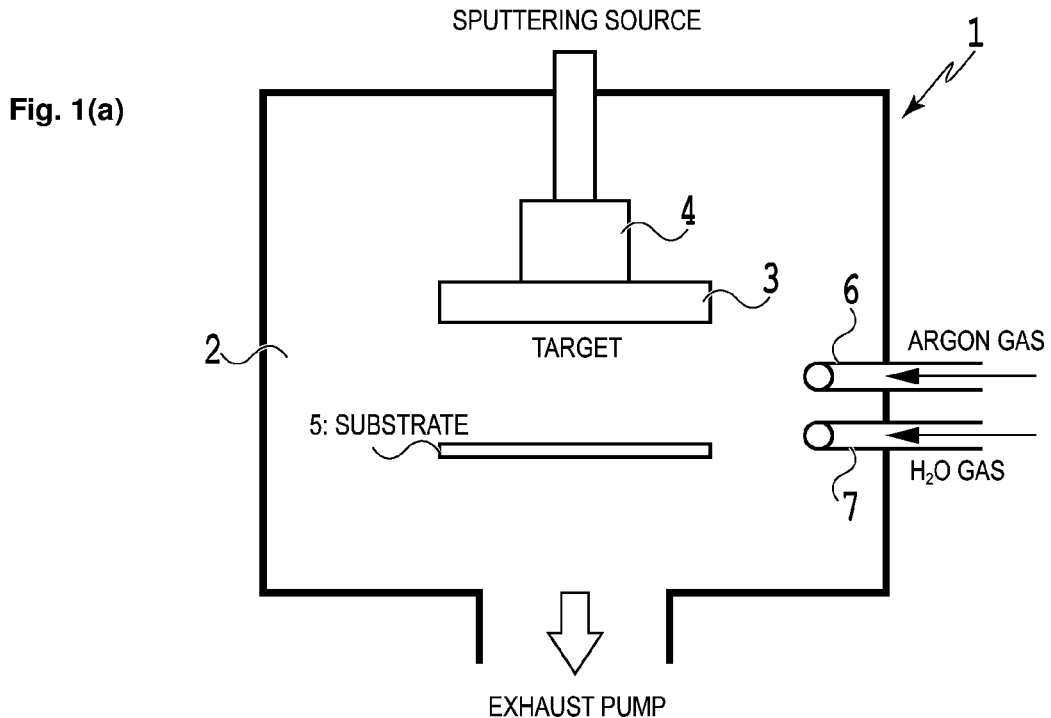
FIG. 1(a) is a conceptual diagram of a sputtering apparatus with a single sputtering source.
Figure 1B:
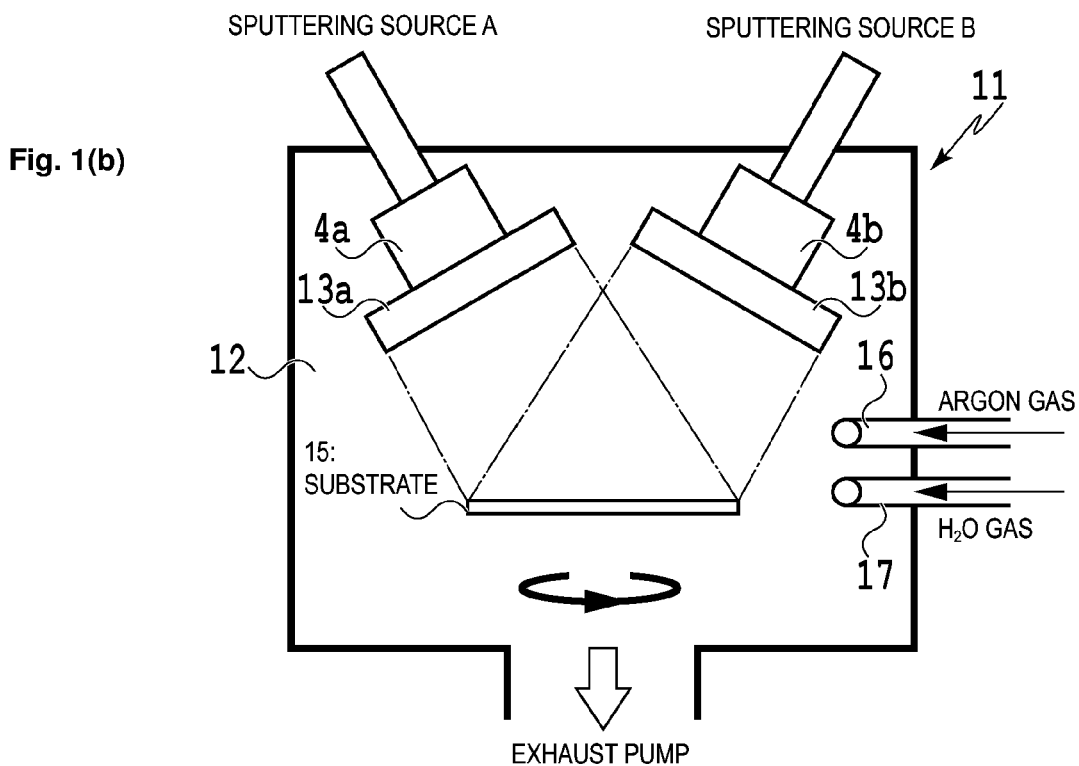
FIG. 1(b) is a conceptual diagram of a sputtering apparatus with a double sputtering source.

FIG. 1 is a conceptual diagram of sputtering apparatuses 1 and 11. FIG. 1(a) illustrates a case where a single sputtering source is provided, and FIG. 1(b) illustrates a case where a double sputtering source is provided.

In the related art, $Bi_2O_3$:Er film is obtained by a sputtering apparatus 1 including a single sputtering source as illustrated in FIG. 1(a). The sputtering target 3 is $Bi_2O_3$ containing a predetermined amount of Er atoms. An Er:$Bi_2O_3$ film is formed on the substrate 5 using the single sputtering target 3.

Here, the sputtering apparatus 1 will be described. The inside of the film forming chamber 2 of the sputtering apparatus 1 is evacuated to a vacuum, and inside the film forming chamber 2, the sputtering target 3, the holding mechanism 4, the substrate 5, a heater (not shown), a gas introduction port 6, and a variable leak valve 7 are provided.

A substrate 5 is disposed at a position facing the sputtering target 3, and the substrate 5 is placed on a heater. Film formation can be performed while heating the substrate 5 with a heater, or post-annealing can be performed after the film formation is completed and the film forming chamber 2 is evacuated.

The sputtering apparatus 1 includes a gas introduction port 6 and a variable leak valve 7 which are connected to the film forming chamber 2 from the outside. Argon gas as a sputtering gas is introduced into the film forming chamber 2 through the gas introduction port 6. Further, the $H_2O$ gas as an oxygen source is introduced into the film forming chamber 2 through the variable leak valve 7.

The sputtering target 3 is held by the holding mechanism 4 such that the distance to the substrate 5 and the like are appropriate. The sputtering apparatus 1 further includes a mechanism (not shown) for generating a high frequency electric field or magnetic field between the target 3 and the substrate 5 or in the vicinity of the substrate 5 in order to realize a predetermined condition for sputtering film formation. Here, the $H_2O$ gas introduced into the film forming chamber 2 through the variable leak valve 7 generates oxygen radicals in the plasma state, and the degree of oxidation of the $Bi_2O_3$:Er film can be adjusted.

Here, in the case where the $H_2O$ gas is introduced to form the $Bi_2O_3$:Er film, the sputtering film formation is performed at room temperature without heating the substrate so that only hydrogen is not selectively desorbed from the $H_2O$ molecules taken in the $Bi_2O_3$:Er film.

A $Bi_2O_3$:Er film can be formed by using the sputtering apparatus 1 shown in FIG. 1(a). However, the Er content in the chemical composition of the $Bi_2O_3$:Er film formed on the substrate 5 is unfortunately fixed according to the chemical composition of the sputtering target 3.

EXAMPLE

An embodiment of the present invention will be described in detail below. The embodiment of the present invention is given by way of example and not by way of limitation. Further, the present invention may be modified or replaced without departing from the scope of the present invention.

In one embodiment of the present invention, a $Bi_2O_3$:Er film is formed using the sputtering apparatus 11 including the double sputtering source shown in FIG. 1(b) so as to compensate for the above disadvantages and to freely adjust the Er content in the $Bi_2O_3$:Er film.

The above-described sputtering apparatus 1 of FIG. 1(a) has a single sputtering target 3 in the film forming chamber 2, while the sputtering apparatus 11 shown in FIG. 1(b) includes two sputtering targets 13a and 13b in the film forming chamber 12. The sputtering apparatus 11 includes $Bi_2O_3$ as a sputtering target 13a for the sputtering source A and $Er_2O_3$ as a sputtering target 13b for the sputtering source B, and is capable of simultaneously sputtering both of them and changing the content of Er atoms in the Er:$Bi_2O_3$ film deposited on the substrate 15 according to the sputtering power (electric power) applied to the respective sputtering targets 13a and 13b.

At this time, the density of each particle scattered from the sputtering targets 13a and 13b on the surface of the substrate 15 is inversely proportional to the square of the distance from the sputtering targets 13a and 13b, and therefore varies depending on the position of the substrate 15 in the horizontal plane. Therefore, in order to equalize the composition distribution of the Er:$Bi_2O_3$ film, it is preferable that the substrate 15 be rotated about an axis that is substantially perpendicular to the horizontal plane of the substrate 15 and penetrates the horizontal plane of the substrate 15 during the deposition of the Er:$Bi_2O_3$ film on the substrate 15.

Further, according to the configuration of the sputtering apparatus 11 illustrated in FIG. 1(b), target particles can be generated by using different sputtering methods for each of the sputtering targets 13a and 13b. In the present embodiment, an electron cyclotron resonance (hereinafter referred to as ECR) plasma source was directed toward the $Bi_2O_3$ target 13a, and a radio frequency (hereinafter referred to as RF) magnetron source was installed toward the $Er_2O_3$ target.

The microwave input power for generating ECR plasma was fixed at 500 W, and the RF power applied to the $Er_2O_3$ target was fixed at 500 W. The power applied to the RF magnetron source was set to 40 W.

The inside of the film forming chamber 12 of the sputtering apparatus 11 was evacuated by a turbo molecular pump (not shown) installed as an exhaust pump outside, and the degree of vacuum inside the film forming chamber 12 was $1 \times 10^{-4}$ Pa. The amount of argon gas introduced into the film forming chamber 12 was adjusted to 0.12 Pa using a mass flow controller (not shown) installed in the gas introduction port 16.

Simultaneously with the introduction of the argon gas into the film forming chamber 12, the $H_2O$ gas is introduced into the film forming chamber 12 from the variable leak valve 17, and the introduction pressure was set to a value of $1 \times 10^{-2}$ Pa to $5.3 \times 10^{-2}$ Pa.

The concentration of Er contained in the $Bi_2O_3$:Er film obtained under the above sputtering film formation conditions was 2 at. % with respect to Bi. The concentration of Er was quantified by a fluorescent X-ray analysis method.

As the substrate 15, a 4-inch Si (100) substrate or a Si (100) substrate in which a silicon thermal oxide film ($SiO_2$) having a thickness of 1 μm is formed as an upper layer was used. Further, as a sample for measuring the spectral transmittance of the $Bi_2O_3$:Er film, a $Bi_2O_3$:Er film was formed on a glass substrate.

The post-annealing temperature was changed in a range from room temperature to 600° C. After forming the $Bi_2O_3$:Er film, a plurality of 12 mm square samples were cut out from a region of the substrate 15 where the Er concentration was constant, and post-annealing treatment was performed on samples in an oxygen gas atmosphere at various temperatures.

The emission spectrum of the $Bi_2O_3$:Er film by photoluminescence (hereinafter referred to as PL spectrum) was obtained by using a semiconductor laser having a wavelength of 532 nm as excitation light and measuring the near-infrared emission intensity in the wavelength range of 1438 nm to 1600 nm by a CCD detector. The infrared light emission measured here is caused as follows: $Er^{3+}$ ions are excited by excitation light to cause energy transition from $^4I_{15/2}$ to $^2H_{11/2}$, and $Er^{3+}$ ions are released to emit light along with the energy transition from $^4I_{13/2}$ to $^4I_{15/2}$.

The produced phase of the $Bi_2O_3$:Er film was identified by measuring an X-ray diffraction pattern using an X-ray diffractometer. The measuring method is ω-2θ scanning.

In addition, as a control experiment, film formation was performed under the condition that the gas introduced from the variable leak valve 17 into the film forming chamber 12 was oxygen gas instead of $H_2O$ gas. The oxygen gas introduction pressure at this time was set to a value of $4.3 \times 10^{-2}$ Pa to $8.6 \times 10^{-2}$ Pa.

Figure 2:
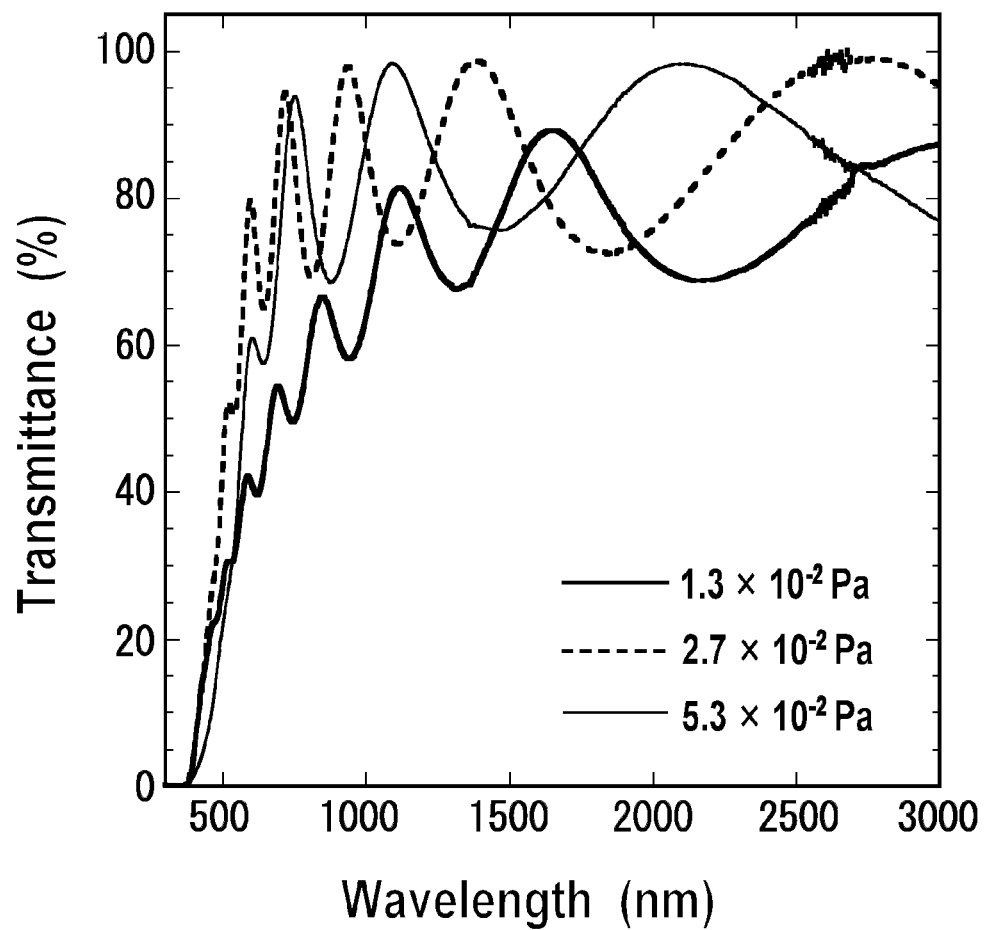
FIG. 2 is a graph showing the spectral transmittance of $Bi_2O_3$:Er films obtained according to an embodiment of the present invention.

FIG. 2 is a graph showing the spectral transmittance of the $Bi_2O_3$:Er films obtained according to the embodiment of the present invention. The introduction pressure of $H_2O$ gas introduced into the film forming chamber 12 was set to $1.3\times10^{-2}$ Pa, $2.7\times10^{-2}$ Pa, and $5.3\times10^{-2}$ Pa. The $Bi_2O_3$:Er films used for the measurement of the spectral transmittance are samples that have not been post-annealed.

In the spectral transmittance shown in FIG. 2, in common to all levels, a periodic variation amount was superimposed on the spectral transmittance of the $Bi_2O_3$:Er films themself due to optical interference at the interface between the $Bi_2O_3$:Er films and the glass substrate. When the introduction pressure of $H_2O$ gas was the lowest level, that is, $1.3\times10^{-2}$ Pa, the spectral transmittance in the visible region was lower than other levels. This indicates that the $Bi_2O_3$:Er films contains Bi atoms that are not completely terminated with oxygen. Further, the wavelength at the absorption edge is 380 nm regardless of the value of the introduction pressure of $H_2O$ gas. When the introduction pressure of $H_2O$ gas is $2.7\times10^{-2}$ Pa and $5.3\times10^{-2}$ Pa higher than $1.3\times10^{-2}$ Pa, the spectral transmittance at wavelengths longer than 800 nm periodically changes in the range from 75% to 100%. This result shows that the spectral transmittance of the $Bi_2O_3$:Er films is a constant value in the range from 75% to 100% at a wavelength longer than 800 nm, except for the effect of optical interference at the interface between the $Bi_2O_3$:Er films and the glass substrate, and suggests that the films are sufficiently transparent.

Figure 3:
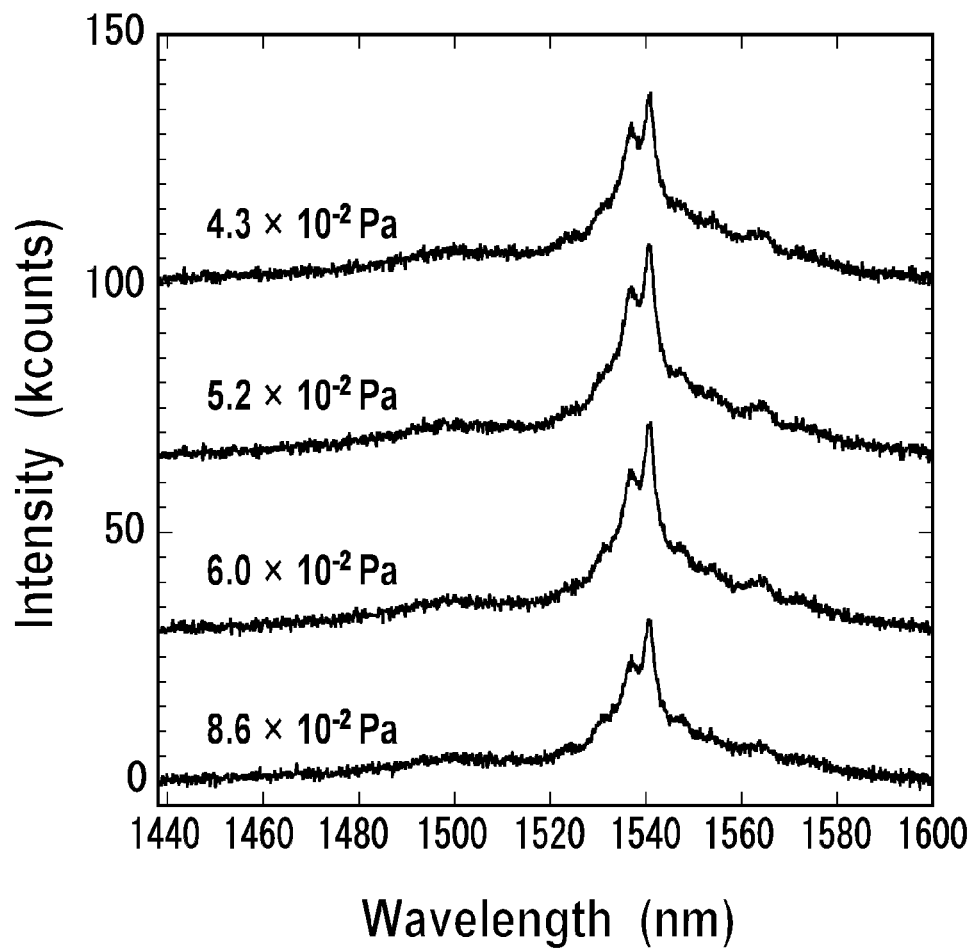
FIG. 3 is a graph showing a photoluminescence spectra of $Bi_2O_3$:Er films formed by changing the introduction pressure of oxygen gas as a control experiment.

FIG. 3 is a graph showing PL spectra of $Bi_2O_3$:Er films formed by introducing oxygen gas into the film forming chamber 12 and changing the introduction pressure of oxygen gas. The post-annealing treatment temperature for the sample measured at this time was 450° C., which is common to all levels.

The emission intensity in the vicinity of 1540 nm, which shows the emission from $Er^{3+}$ ions, hardly depends on the introduction pressure of oxygen gas during film formation, and is about 40 kilocounts at any level. This indicates that the degree of oxidation of the $Bi_2O_3$:Er film with an Er concentration of 2 at. % formed on a Si (100) substrate is unlikely to depend on the introduction pressure of oxygen gas. That is, it means that it is difficult to control the degree of oxidation of the $Bi_2O_3$:Er film even if the introduction pressure of oxygen gas is adjusted.

Figure 4:
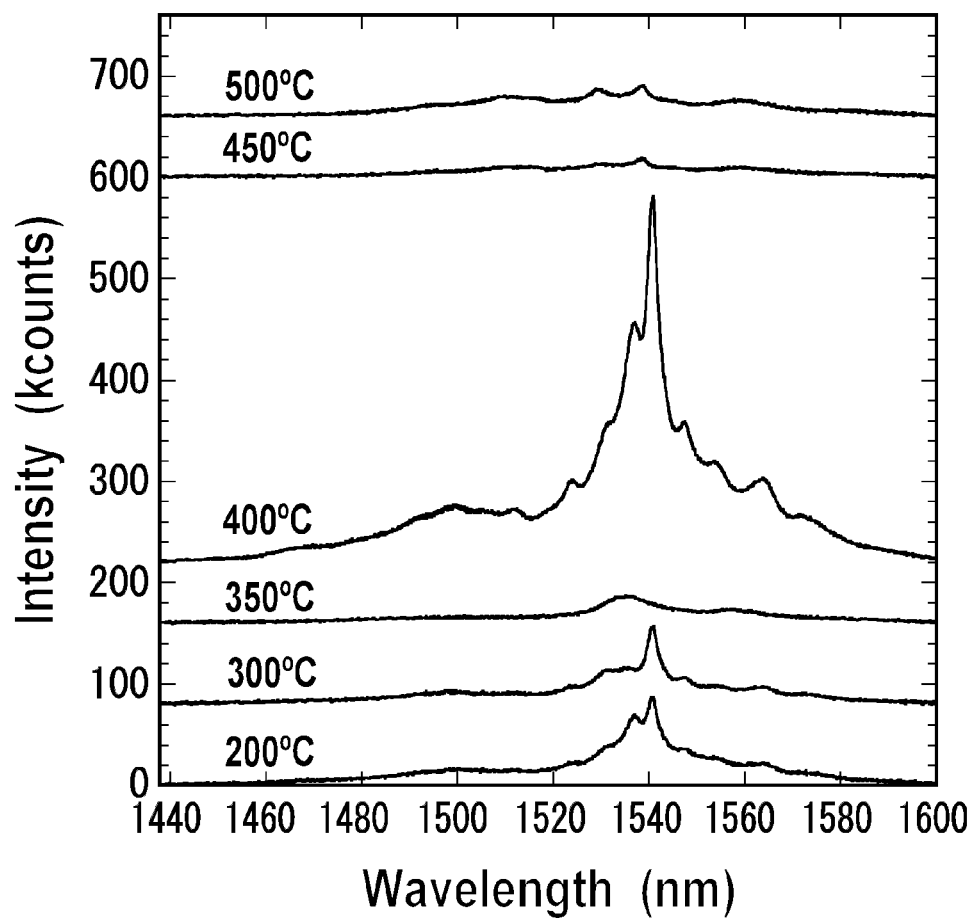
FIG. 4 is a graph showing the photoluminescence emission spectra of a $Bi_2O_3$:Er film which was post-annealed at various temperatures after forming a film on a Si(100) substrate with an introduction pressure of $H_2O$ gas of $3.7 \times 10^{-2}$ Pa.

FIG. 4 is a graph showing a photoluminescence emission spectra of a $Bi_2O_3$:Er film which was post-annealed at various temperatures after forming a film on a Si(100) substrate with an $H_2O$ gas introduction pressure of $3.7\times10^{-2}$ Pa. The post-annealing treatment temperature for the samples measured at this time was from 200° C. to 500° C.

In particular, when post-annealing treatment was performed at 400° C., high-intensity light emission of about 360 kilocounts was exhibited. Further, the post-annealing treatment at 200° C. and 300° C. showed a significantly lower emission intensity than the post-annealing treatment at 400° C., but the shape of the emission spectrum was similar to that in the case of performing the post-annealing treatment at 400° C. On the other hand, when post-annealing treatment was performed at 350° C., the spectral shape of the emission peak was different from those. Further, when the post-annealing treatment was performed at 450° C. and 500° C., the emission intensity was extremely reduced.

The reason why the emission intensity changes irregularly with respect to the post-annealing temperature is that when $H_2O$ gas is introduced from the variable leak valve 17 into the film forming chamber 12, the $H_2O$ gas is ubiquitous in the film forming chamber 12, and the concentration of the supplied $H_2O$ gas becomes nonuniform with respect to the position on the substrate 15.

Further, as can be seen from the PL spectrum when the post-annealing treatment is performed at 400° C., the emission spectrum of $Er^{3+}$ ions has some fine structures. This is due to the crystal field splitting due to the crystal structure of the $Bi_2O_3$:Er film.

Figure 5:
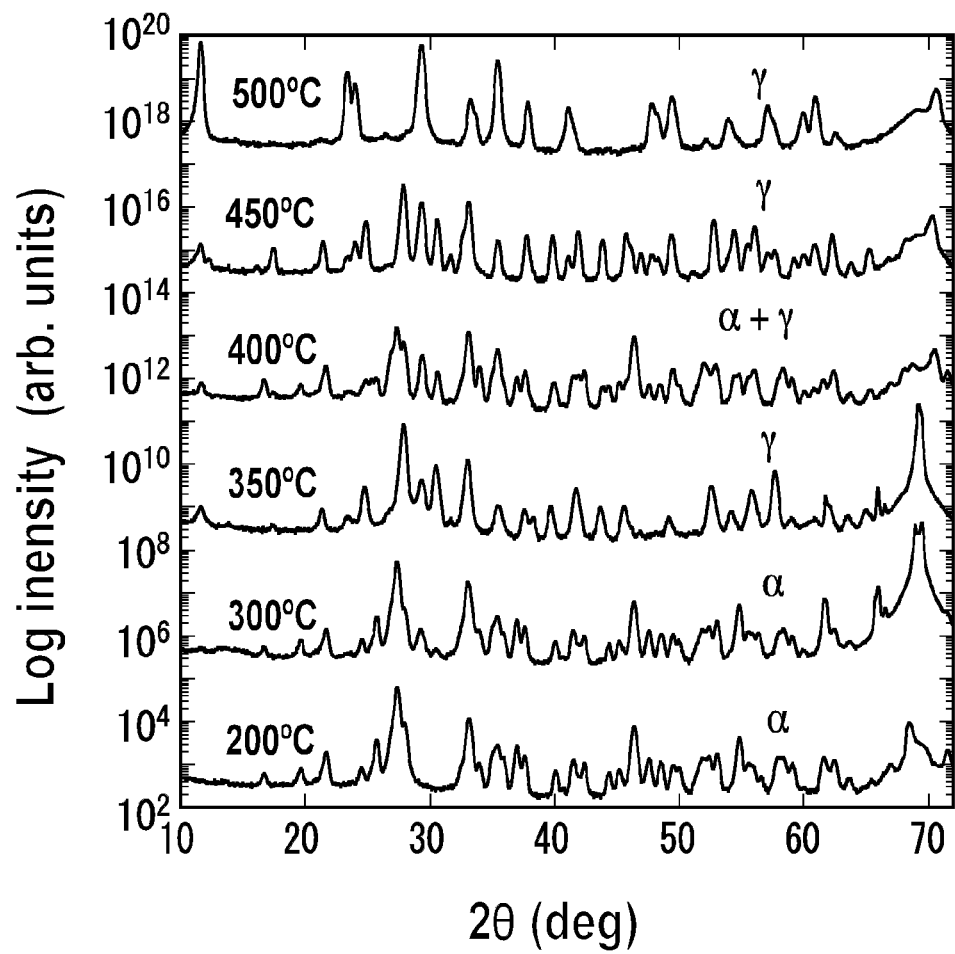
FIG. 5 is a graph showing X-ray diffraction patterns measured for individual samples in FIG. 4.

FIG. 5 is a graph illustrating an X-ray diffraction patterns measured for individual samples in FIG. 4. As a typical crystal structure of $Bi_2O_3$, four kinds of crystal structures of α, β, γ, and δ are known (NPLs 1 to 4), and along with the crystallization of the $Bi_2O_3$:Er film, a single crystal phase or a mixture of two or more thereof forms a crystal phase. In FIG. 5, it can be seen that the crystal phase of the $Bi_2O_3$:Er film is the α phase when the post annealing treatment temperature is low, and shifts to the γ phase as the post annealing treatment temperature is increased. Specifically, the α phase was formed when the post annealing treatment temperature was 200° C. and 300° C., and the mixed phase of the α phase and the γ phase was formed when the post annealing temperature was 400° C.

Considering together with the results shown in FIG. 4, it can be seen that when the post-annealing treatment is performed at a temperature at which the α phase is generated, light emission from $Er^{3+}$ ions with high intensity is exhibited. Further, when the post-annealing temperature was 450° C. and 500° C., it is found that a single phase in which only the γ phase exists was generated, and at this time, extremely weak light emission was exhibited. This result suggests that the inclusion of the α phase in the crystal phase of the $Bi_2O_3$:Er film is the condition for light emission from the high intensity $Er^{3+}$ ion.

Figure 6:
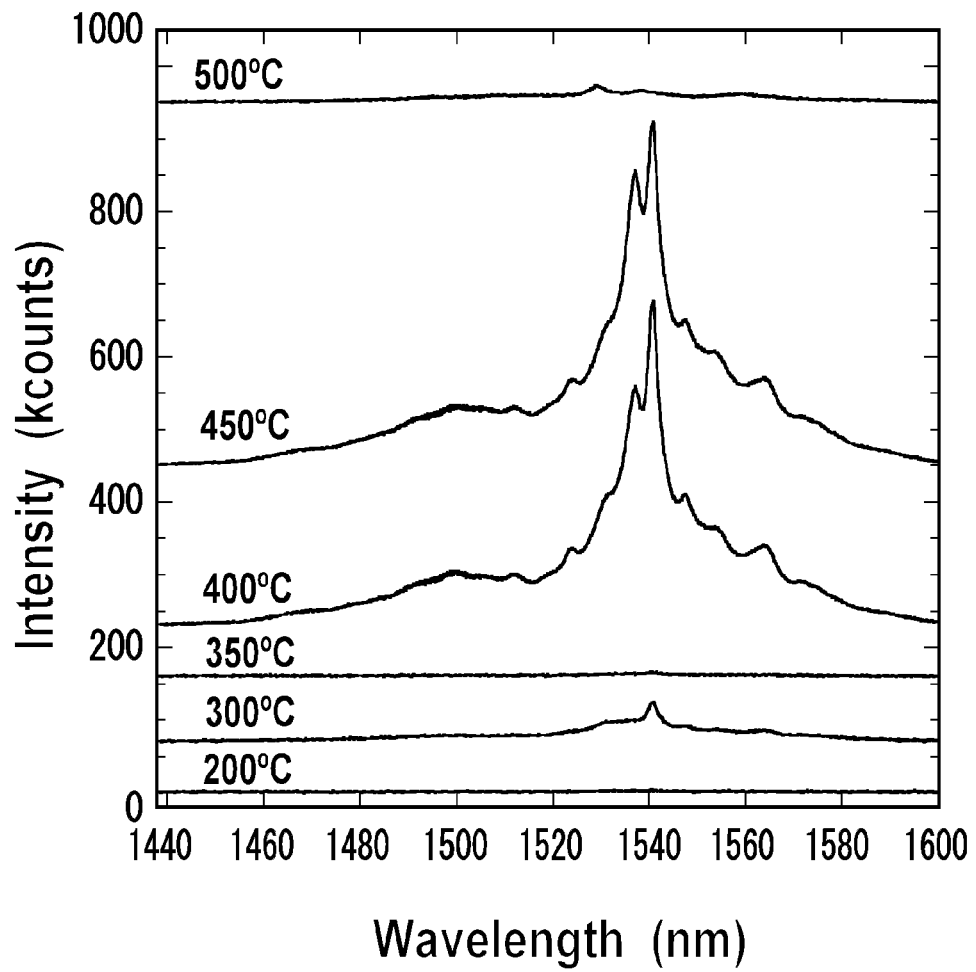
FIG. 6 is a graph showing the photoluminescence emission spectra of a $Bi_2O_3$:Er film which was post-annealed at various temperatures after forming a film on a Si(100) substrate with an introduction pressure of $H_2O$ gas of $1.1 \times 10^{-2}$ Pa.

FIG. 6 is a graph showing the PL spectra of the $Bi_2O_3$:Er film which was post-annealed at various temperatures after forming a film on a Si(100) substrate with an introduction pressure of $H_2O$ gas of $1.1\times10^{-2}$ Pa. When the post-annealing temperature was 400° C. and 450° C., high-intensity light emission of about 450 to 500 kilocounts was exhibited. The maximum emission intensity in these cases is close to the maximum emission intensity when the introduction pressure of $H_2O$ gas shown in FIG. 4 is $3.7\times10^{-2}$ Pa and the post-annealing temperature is 400° C., and is an order of magnitude higher than the emission intensity in the case of forming a film by introducing oxygen gas shown in FIG. 3. This indicates that the emission intensity from $Er^{3+}$ ions is increased by about one digit by changing the oxygen source during film formation from oxygen gas to $H_2O$ gas.

Figure 7:
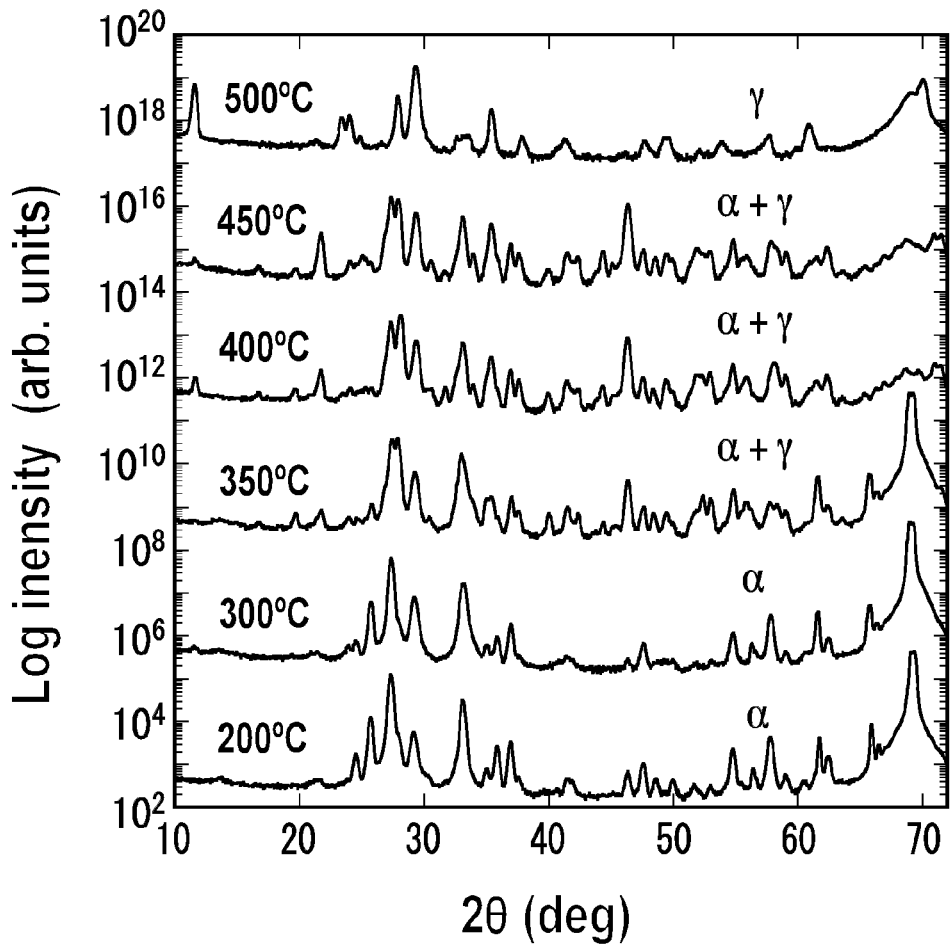
FIG. 7 is a graph showing X-ray diffraction patterns measured for individual samples in FIG. 6.

FIG. 7 is a graph showing X-ray diffraction patterns measured for samples in FIG. 6. The α phase was generated when the post-annealing temperature was from 200° C. to 450° C., and the γ phase was further generated when the post-annealing temperature is from 350° C. to 450° C.

Considering together with the results shown in FIG. 6, this result shows that even when the introduction pressure of $H_2O$ gas is $1.1\times10^{-2}$ Pa, the $Er^{3+}$ ions solid-dissolved or substituted in the $Bi_2O_3$ crystal forming the α phase or $Er^{3+}$ ions bound to the $Bi_2O_3$ crystal surface forming the α phase are optically active.

Figure 8:
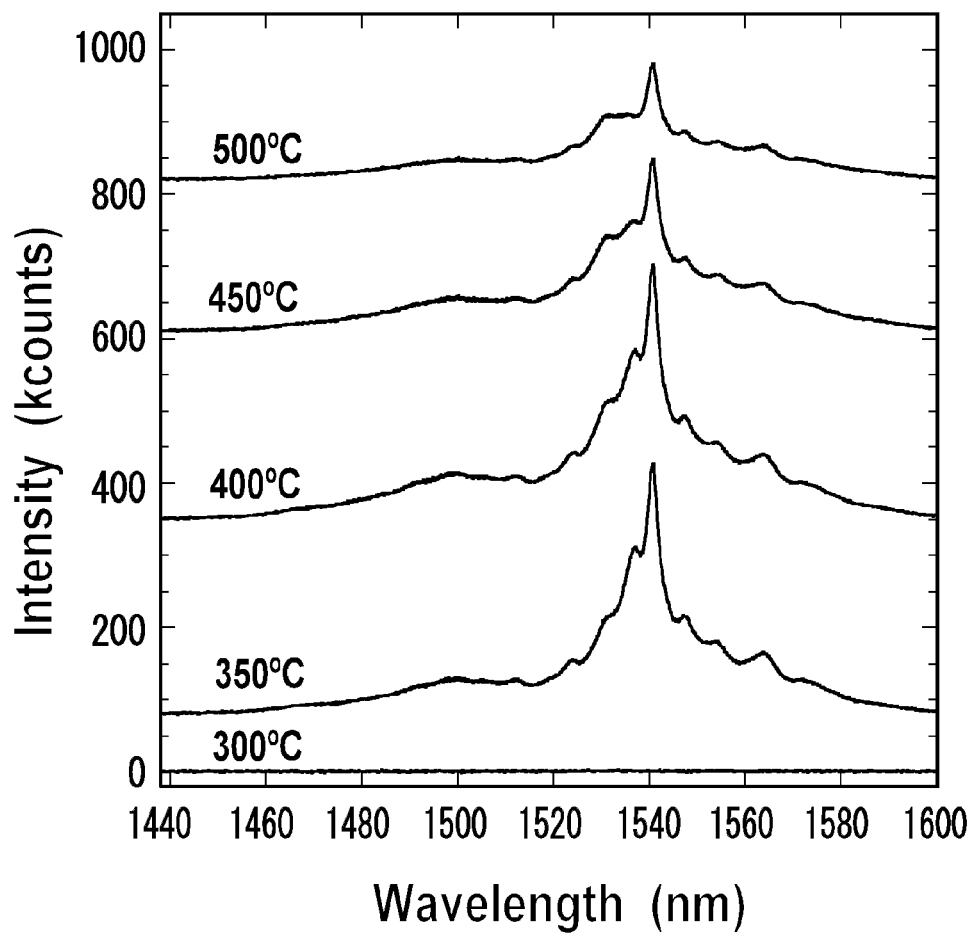
FIG. 8 is a graph showing the photoluminescence emission spectra of a $Bi_2O_3$:Er film which was post-annealed at various temperatures after forming a film on a $SiO_2$ substrate with an introduction pressure of $H_2O$ gas of $5.3 \times 10^{-2}$ Pa.

FIG. 8 is a graph showing PL spectra of a $Bi_2O_3$:Er film which was post-annealed at various temperatures after forming a film on a $SiO_2$ substrate with an introduction pressure of $H_2O$ gas of $5.3\times10^{-2}$ Pa. When the post-annealing temperature was 300° C., no light emission was observed, while when the post-annealing temperature was 350° C. or higher, light emission showing an intensity of 150 to 300 kilocounts was observed. Similar to the case shown in FIG. 6 where the introduction pressure of $H_2O$ gas was $1.1\times10^{-2}$ Pa, the emission intensity when the post-annealing temperature was 500° C. was lower than the emission intensity of the case where the post-annealing temperature was 450° C. This indicates that the emission intensity from $Er^{3+}$ ions does not monotonically increase with the post-annealing temperature.

In summary of the results shown in FIG. 4 and FIG. 6, it can be seen that the maximum emission intensity of 300 kilocounts or more can be obtained by adjusting the post-annealing temperature to a predetermined value regardless of whether the substrate 15 is Si(100) or $SiO_2$. In other words, these results show that when the $H_2O$ gas is introduced to form a film, a high emission intensity can be obtained regardless of the type of substrate.

Figure 9:
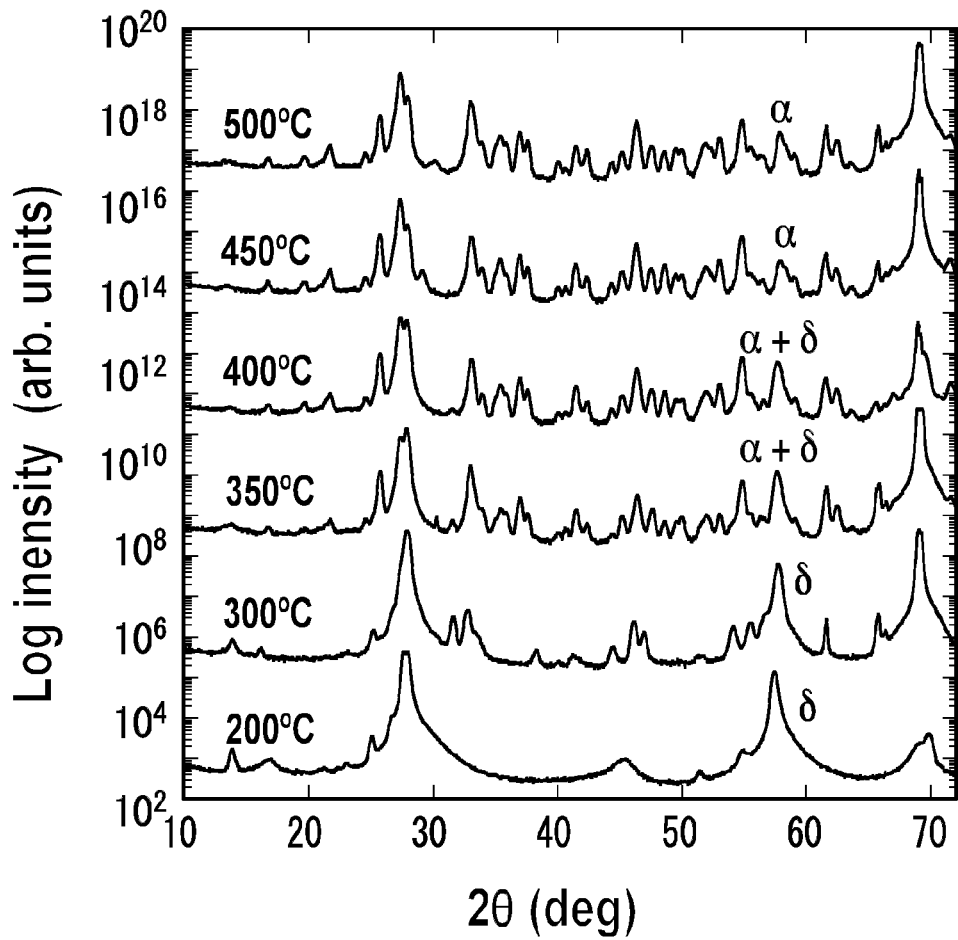
FIG. 9 is a graph showing X-ray diffraction patterns measured for individual samples in FIG. 8.

FIG. 9 is a graph illustrating X-ray diffraction patterns measured for samples in FIG. 8. When the post-annealing temperature was 200° C. and 300° C., only the δ phase was formed and no emission was observed at this time. When the post annealing temperature was 350° C. and 400° C., the $Bi_2O_3$:Er film had a crystal structure in which the α phase is mixed in addition to the δ phase. Further, when the post-annealing temperature was 450° C. or higher, only the α phase was generated.

Considering the results shown in FIGS. 8 and 9 together, it can be seen that the threshold value of the post-annealing temperature at which the $Er^{3+}$ ions emit light matches the threshold value of the post-annealing temperature at which the α phase is generated. That is, it is understood that the existence of the α phase of $Bi_2O_3$ in the $Bi_2O_3$:Er film is a necessary condition for light emission from $Er^{3+}$ ions.

The reason for these results is likely that $Er^{3+}$ ions are easily located at the site capable of emitting light in the $Bi_2O_3$ crystal due to the influence of hydrogen contained in the $H_2O$ gas. It is also possible that the emission efficiency of the $Er^{3+}$ ions is increased because the energy level created by hydrogen contained in the $H_2O$ gas in the band gap of the $Bi_2O_3$ crystal and the $4f$ level of the $Er^{3+}$ ions are close to each other and resonate.

INDUSTRIAL APPLICABILITY

The erbium-doped bismuth oxide film is expected to be used as an optical component having an optical amplification effect similar to that of an erbium-doped optical fiber.

REFERENCE SIGNS LIST 1, 11 Sputtering apparatus
2, 12 Film forming chamber
3, 13a, 13b Sputtering target
4, 4a, 4b Holding mechanism
5, 15 Substrate
6, 16 Sputtering gas introduction port
7, 17 Variable leak valve

The invention claimed is:

1. A method of producing an erbium-doped bismuth oxide film comprising bismuth oxide ($Bi_2O_3$) as a base material and erbium (Er) added to the base material, the method comprising:
a step of disposing a first sputtering target containing the bismuth oxide, a second sputtering target containing erbium oxide ($Er_2O_3$), and a substrate in a closed film forming chamber separately from each other;
a step of setting the temperature of the substrate to room temperature, introducing $H_2O$ gas into the film forming chamber at a predetermined pressure, and supplying $H_2O$ gas in the vicinity of the substrate;
a step of simultaneously sputtering the first sputtering target and the second sputtering target to deposit a part of the first sputtering target and a part of the second sputtering target on the substrate to form a precursor film; and
a step of forming a crystalline film by heating the precursor film at a predetermined temperature,
wherein the crystalline film contains an α phase of bismuth oxide when the predetermined pressure is from $1.1 \times 10^{-2}$ Pa to $5.3 \times 10^{-2}$ Pa.

2. The method of producing an erbium-doped bismuth oxide film according to claim 1, wherein simultaneously sputtering the first sputtering target and the second sputtering target is sputtering the first sputtering target with an electron cyclotron resonance (ECR) plasma source directed toward the first sputtering target.

3. A method of producing an erbium-doped bismuth oxide film comprising bismuth oxide ($Bi_2O_3$) as a base material and erbium (Er) added to the base material, the method comprising:
a step of disposing a first sputtering target containing the bismuth oxide, a second sputtering target containing erbium oxide ($Er_2O_3$), and a substrate in a closed film forming chamber separately from each other;
a step of setting the temperature of the substrate to room temperature, introducing $H_2O$ gas into the film forming chamber at a predetermined pressure, and supplying $H_2O$ gas in the vicinity of the substrate;
a step of simultaneously sputtering the first sputtering target and the second sputtering target to deposit a part of the first sputtering target and a part of the second sputtering target on the substrate to form a precursor film; and
a step of forming a crystalline film by heating the precursor film at a predetermined temperature,
wherein the crystalline film contains the α phase of the bismuth oxide when the predetermined temperature is from 200° C. to 500° C.

4. The method of producing an erbium-doped bismuth oxide film according to claim 1, wherein the step of forming the crystalline film is performed in an oxygen gas atmosphere.

5. The method of producing an erbium-doped bismuth oxide film according to claim 1, wherein the substrate is silicon (Si) or silicon dioxide ($SiO_2$).

6. The method of producing an erbium-doped bismuth oxide film according to claim 3, wherein the crystalline film contains an α phase of bismuth oxide when the predetermined pressure is from $1.1 \times 10^{-2}$ Pa to $5.3 \times 10^{-2}$ Pa.

7. The method of producing an erbium-doped bismuth oxide film according to claim 2, wherein the crystalline film contains the α phase of the bismuth oxide when the predetermined temperature is from 200° C. to 500° C.

8. The method of producing an erbium-doped bismuth oxide film according to claim 1, wherein the crystalline film contains the α phase of the bismuth oxide when the predetermined temperature is from 200° C. to 500° C.

9. The method of producing an erbium-doped bismuth oxide film according to claim 2, wherein the step of forming the crystalline film is performed in an oxygen gas atmosphere.

10. The method of producing an erbium-doped bismuth oxide film according to claim 3, wherein the step of forming the crystalline film is performed in an oxygen gas atmosphere.

11. The method of producing an erbium-doped bismuth oxide film according to claim 2, wherein the substrate is silicon (Si) or silicon dioxide ($SiO_2$).

12. The method of producing an erbium-doped bismuth oxide film according to claim 3, wherein the substrate is silicon (Si) or silicon dioxide ($SiO_2$).

13. The method of producing an erbium-doped bismuth oxide film according to claim 4, wherein the substrate is silicon (Si) or silicon dioxide ($SiO_2$).

* * * * *